United States Patent
Gouin et al.

(10) Patent No.: US 7,355,915 B2
(45) Date of Patent: Apr. 8, 2008

(54) MEMORY CIRCUIT WITH SUPPLY VOLTAGE FLEXIBILITY AND SUPPLY VOLTAGE ADAPTED PERFORMANCE

(75) Inventors: Vincent Gouin, Mandelieu (FR); Jean-Patrice Coste, Antibes (FR); Christophe Chanussot, Antibes (FR)

(73) Assignee: Infineon Technologies AG, Munich (DE)

(*) Notice: Subject to any disclaimer, the term of this patent is extended or adjusted under 35 U.S.C. 154(b) by 59 days.

(21) Appl. No.: 11/212,082

(22) Filed: Aug. 24, 2005

(65) Prior Publication Data

US 2006/0050572 A1 Mar. 9, 2006

(30) Foreign Application Priority Data

Aug. 24, 2004 (EP) .................... 04020080

(51) Int. Cl.
*G11C 7/02* (2006.01)
*G11C 7/10* (2006.01)

(52) U.S. Cl. ................. 365/210; 365/189.08; 365/194; 365/230.06; 365/226; 365/185.2

(58) Field of Classification Search ............... 365/210, 365/189.08, 230.06, 226, 205, 207, 208, 365/185.2, 194

See application file for complete search history.

(56) References Cited

U.S. PATENT DOCUMENTS

| 5,132,932 | A  |   | 7/1992  | Tobita |
|-----------|----|---|---------|--------|
| 5,596,539 | A  | * | 1/1997  | Passow et al. ............... 365/210 |
| 5,936,905 | A  |   | 8/1999  | Proebsting |
| 6,462,998 | B1 |   | 10/2002 | Proebsting |
| 6,646,938 | B2 | * | 11/2003 | Kodama ...................... 365/210 |
| 6,690,608 | B2 | * | 2/2004  | Nii et al. .................... 365/210 |
| 6,717,877 | B2 | * | 4/2004  | Suzuki et al. ............... 365/210 |
| 6,804,153 | B2 | * | 10/2004 | Yoshizawa et al. ......... 365/210 |
| 6,831,853 | B2 | * | 12/2004 | Lin et al. .................... 365/210 |
| 6,999,367 | B2 | * | 2/2006  | Yamagami ................... 365/210 |
| 7,035,149 | B2 | * | 4/2006  | Shimizu ...................... 365/210 |
| 2003/0042955 | A1 |   | 3/2003 | Nakayama et al. |

* cited by examiner

*Primary Examiner*—Trong Phan
(74) *Attorney, Agent, or Firm*—Patterson & Sheridan, L.L.P.

(57) ABSTRACT

The inventive memory circuit comprises a plurality of memory cells. The memory circuit further comprises a memory access means being controlled by at least one control signal. In addition, a control means for generating the at least one control signal is contained in the memory circuit, with the control means comprising a delay means. The delay means delays a switching of the at least one control signal. The delay time is adjustable in view of the applied supply voltage.

6 Claims, 4 Drawing Sheets

MEMORY CIRCUIT WITH SUPPLY VOLTAGE FLEXIBILITY AND SUPPLY VOLTAGE ADAPTED PERFORMANCE

CROSS-REFERENCE TO RELATED APPLICATIONS

This application claims foreign priority benefits under 35 U.S.C. §119 to co-pending European patent application number EP 04 020 080.0, filed 24 Aug. 2004. This related patent application is herein incorporated by reference in its entirety.

BACKGROUND OF THE INVENTION

1. Field of the Invention

The invention relates to memory circuits, particularly to SRAM circuits.

2. Description of the Related Art

SRAM (static random access memory) is internally organized as illustrated in FIG. 1. The SRAM-type memory comprises a memory cell array 15 of 1-bit memory cells 1 with m rows and n columns. Each memory cell is based on a flip-flop (typically CMOS-type) as the memory core cell with positive feedback for the storage of the data (not shown). The differential data outputs of the flip-flop are selectively coupled to differential bit lines $bl_j$ and $bln_j$ by memory cell internal select transistors (not shown), which are driven by a corresponding word line $wl_i$. The bit lines $bl_j$ and $bln_j$ are usually precharged to a specific voltage level (usually the supply voltage $V_{dd}$) by precharging circuits P.

Each memory cell 1 is addressed by a row address signal 2 and a column address signal 3 with Id(m)- and Id(n)-bit word-length, respectively. The row address signal 2 is decoded in a row decoder 4 to select one of the m rows. In a similar way, the column address signal 3 is decoded in a column decoder 5 to select one of the n columns. Each row of memory cells is coupled to one word line $wl_i$. In the event a row is selected, the corresponding word line $wl_i$ exhibits a logically high potential. The selection of a word line is resetable by a signal wl_resetn which resets all word lines to a logically low level in case wl_resetn is high. This is realized by m AND-gates driving the m word lines, with each AND-gate being connected to one output signal $a_i$ of the row decoder and the signal wl_resetn. For the selection of one of the n columns each of the n output signals of the column decoder 5 is connected to one of n total column switches 6. In the event a column is selected, the corresponding pair of differential bit lines $bl_j$ and $bln_j$ is connected to the differential pair of data I/O lines 7 via the corresponding column switch 6.

For read access and write access the data I/O lines 7 are connected to the differential input sa and san of a sense amplifier 8 and to the differential output of a write buffer 9, respectively. In general, a dynamic sense amplifier 8 is employed, with its operation being controlled by a control signal saen. The signal saen activates the amplifier 8 when switching from low to high. The dynamic sense amplifier 8 is based on an internal positive feedback, which speeds up the signal detection compared to a static sense amplifier. In addition, a dynamic sense amplifier 8 also consumes less power compared to a static sense amplifier since it switches to zero power as soon as it has made a decision. Similar to the dynamic sense amplifier 8, the operation of the write buffer 9 is controlled by a control signal irwb which activates or deactivates the driving of the I/O data lines 7 and the therewith connected bit lines $bl_j$ and $bln_j$, when switching from low to high level or from high to low level, respectively.

FIG. 2 illustrates the SRAM-internal timing during a memory read access. The transient voltage curves 10 and 11 are related to the differential inputs sa and san of the sense amplifier 8, whereas the transient voltage curve 12 relates to the control signal saen for sense amplifier activation. At the beginning of the memory read process the inputs sa and san and the connected bit lines $bl_j$ and $bln_j$ are still precharged to $V_{dd}$, with $V_{dd}$ being the positive supply voltage. The recharge of the inputs sa and san with respect to the memory cell internal voltages is delayed because of parasitic capacitances (mainly parasitic capacitances of the bit lines $bl_j$ and $bln_j$). At a time instant $t_a$ the sense amplifier 8 is activated when the control signal saen switches from low to high. The differential voltage between the signals sa and san at the time instant $t_a$ is defined as the read margin $\Delta$sa. The earlier the sense amplifier 8 is activated, the smaller $\Delta$sa is and the faster the read operation is. But the smaller $\Delta$sa is, the more critical the detection of the signal is that is read out of the memory cell. Since the recharging capability of a selected memory cell 1 may vary from memory circuit to memory circuit as well as from memory cell to memory cell and in addition the detection capability of a sense amplifier 8 may vary from memory circuit to memory circuit, the read margin $\Delta$sa is typically set as a value which provides a desired level of safe operation. Thus, there is a trade-off between memory speed and safety of operation when setting the read margin $\Delta$sa. At the end of the read operation the wordline $wl_i$ is deactivated by switching the signal wl_resetn (cf. FIG. 1) from high to low (not shown).

FIG. 3 illustrates the SRAM-internal timing during a memory write access. The transient voltage curves 20 and 21 are related to the signal on the selected word line $wl_i$ and the signal irwb which controls the operation of the write buffer 9, respectively. The transient voltage curves 22 and 23 relate to differential internal voltage levels c and cn of the flip-flop in the selected memory cell. The transient voltage curves 24 and 25 relate to the voltage levels on the differential bit line $bl_j$ and $bln_j$. For the write access, first the signal irwb is switched from low to high to activate the write buffer 9. After the signal on the selected word line $wl_i$ switches from low to high, a recharge of the bit lines $bl_j$ and $bln_j$ and the internal voltages c and cn of the selected flip-flop according to the data input signal of the write buffer 9 is initiated. After the recharge of the internal voltages c and cn is sufficient to switch the state of the flip-flop (due to flip-flop internal positive feedback), the write buffer 9 is deactivated by switching the signal irwb from high to low. The word line $wl_i$ has to be maintained activated during the commutation of the flip-flop. Afterwards the wordline $wl_i$ is deactivated by switching the signal wl_resetn (cf. FIG. 1) from high to low (not shown). After closing the wordline (and typically not before) the differential bit line $bl_j$ and $bln_j$ is recharged to a precharging level by the precharging circuits P (cf. FIG. 1). For the write access, the write margin $\Delta$t is a defined time-based value. The write margin $\Delta$t is defined by the time window which is described by the time instance $t_1$ when the flip-flop-internal node-voltage cn crosses $V_{dd}/2$ and the time instance $t_2$ when the falling edge of the voltage on the word line $wl_i$ crosses $V_{dd}/2$ (word line deactivation). The larger the write margin $\Delta$t, the later the word line $wl_i$ is deactivated and the more a correct commutation of the flip-flop is guaranteed. The smaller the write margin $\Delta$t is, the faster the write operation is. Thus, there is a trade-off between memory speed and safety of operation when setting the write margin $\Delta t$.

The document U.S. Pat. No. 5,936,905 describes a self-adjusting delay circuit in an SRAM circuit. The delay circuit relates only to read access and adjusts the internal timing with respect to the activation of a dynamic sense amplifier. The delay circuit comprises a dummy word line which replicates a corresponding word line and is connected to a number n of parallel dummy transistors. The number n of parallel dummy transistors is the same than the number of transistors connected to the corresponding word line. A subset m of these n dummy transistors drives a dummy bit line which replicates a corresponding bit line. The activation signal related to the dynamic sense amplifier is derived from the voltage level on the dummy bit line. To counteract process variation regarding the characteristics of the memory circuit and therewith related timing mismatch, the delay of the delay circuit is programmable by setting the number of transistors m driving the dummy bit line.

Due to these above-mentioned timing constraints, state-of-the-art memory circuits, particularly SRAM circuits, are only operational within a small range of the nominal supply voltage. In case the actual applied supply voltage is lower, the read margin $\Delta sa$ and the write margin $\Delta t$ might be too small and the operation of the memory circuit might fail.

In such SRAM circuits, the supply voltage may be constant. However, in some cases, a constant supply voltage may have undesirable dynamic and static power consumption. Accordingly, what is needed is a method and apparatus for reducing dynamic and static power consumption in a SRAM circuit.

SUMMARY OF THE INVENTION

It is an object of the present invention to provide a memory circuit which is flexibly usable within a broad range for the supply voltage, with the memory circuit guaranteeing safe operation for this range.

The memory circuit according to one embodiment of the invention comprises a plurality of memory cells, which are organized in rows and columns. The memory circuit further comprises a memory access means, which is controlled by at least one control signal. In addition, a control means for generating the at least one control signal is contained in the inventive memory circuit, with the control means comprising a delay means. The delay means delays a switching of the at least one control signal. The respective delay time is adjustable in view of the applied supply voltage.

The delay time being adjustable in view of the supply voltage is employed to counteract the dependency of the characteristics of the memory circuit on the applied supply voltage. Generally, the circuit-internal signal detection capability is reduced with decreasing supply voltage. During read access a sense amplifier being part of the memory access means typically needs a larger voltage swing for signal detection, which is equivalent to a larger read margin. On the other hand, during write access a selected flip-flop in a memory cell may require a higher voltage swing before deactivating the write buffer and the selected word line, which results in a desire to increase the write margin. Thus, both the read and the write margin should be increased when reducing the supply voltage, thereby reducing the operating speed of the memory circuit.

Additionally, the read and write margins may be increased with decreasing supply voltage because of the increasing impact of the threshold-voltage mismatch and other mismatches in the memory core cells, i.e., in the flip-flops. In general, if the supply voltage is reduced, the signal swing is also reduced (e.g., in CMOS circuits). This results in a decreased signal-to-noise-ratio (the threshold-voltage variance can be regarded as noise).

In one embodiment, a memory circuit provides the capability to adapt those margins to the actual applied supply voltage by adjusting the timing for the at least one control signal, e.g., an activation signal for a dynamic sense amplifier. Therefore, in one embodiment, the memory circuit guarantees safe operation even for low supply voltages.

By adjusting the delay and thereby the read and/or write margins the memory circuit may be applied to a low supply voltage resulting in low power consumption and low operating speed in case the operating speed is not crucial. Alternatively, by choosing an appropriate adjustment the memory circuit may be applied to a high supply voltage in case the maximum operating speed is required.

In one embodiment, every control signal of the data access unit is derived from the delay unit. In addition, in one embodiment, the delay time may not be constant where more than one control signals are derived for the delay unit. One embodiment may provide different adjustable delay times assigned to different control signals.

In one embodiment, the memory access means supports a memory read access mode and a memory write access mode and the delay time is independently selectable for the memory read access mode and for the memory write access mode. This provides a further degree of freedom since the delay time is not only adjustable with respect to supply voltage but also with respect to read or write mode. This added adjustability with respect to read or write mode is based on the recognition that the supply voltage driven impact on the memory characteristics, particularly the timing characteristics, may be different for read and write access. Therefore, the timing of the at least one control signal in the advantageous memory circuit may be independently optimized for read and write access.

In one embodiment, the memory circuit comprises a plurality of bit lines each coupled to a column of the plurality of memory cells. Further, the delay means comprises a dummy bit line, the signal transmission behavior of which is essentially characteristic of the signal transmission behavior of each of the bit lines. The dummy bit line is coupled to dummy memory cells which replicate the load of a bit line, i.e., the plurality of memory cells assigned to a bit line. The at least one control signal is generated in dependency of the signal, particularly the voltage signal, on the dummy bit line. The delay means further comprises a driver unit which drives the dummy bit line and discharges the dummy bit line.

In some cases, an a priori unknown delay variation for accessing a memory cell via a capacitive bit line transfers to a more or less identical delay variation with respect to the delay of the dummy bit line in case the bit line and the dummy bit line are matched to each other (for instance, where the load and the driving circuit of both lines are matched). Matching between the bit line and the dummy bit line means that the main characteristic structure features of both transmission lines which impact the line capacitance and the propagation delay of the transmission line are identical, e.g., same length, same width, same thickness and same dielectricity of the isolation. In case the delay for reading the content of a memory cell via a bit line is increased, e.g., caused by semiconductor process variations, the activation of a sense amplifier by the control signal is also delayed by the same additional delay. This leads to a self-adjusting timing architecture. In case the number of dummy memory cells which are connected to the dummy bit line and the number of the memory cells which are connected to the selected bit line are the same, the delay matching is improved.

It is noted that a bit line may be implemented as a differential bit line with two metal lines. The dummy bit line may be implemented as a differential dummy bit line or only as a single bit line with one metal line.

In one embodiment, the driving capability of the driver unit is adjustable. Driving capability means the capability of the driver unit to recharge the load of the driver unit. The higher the driving capability is, the faster the recharge process is. Thus, the driving capability is equivalent to the current driving capability. The driving capability of a driver circuit is determined by the parasitic elements of its equivalent circuit. In general, the larger the transistor area of a driving transistor is, the higher the driving capability is. It should be noted that in some cases, a transistor might comprise several parallel smaller transistors.

In one embodiment, the driver unit comprises a plurality of driver transistors coupled to the dummy bit line, with the total transistor area or size of the one or those driver transistors which are actively driving the bit line is selectable. By altering the total transistor area of the active driving transistors, the driving capability of the driver unit is adjusted. This may be accomplished by switching on one or more transistors of the transistor bank, while switching off the remaining transistors of the transistor bank.

In one embodiment, the driving capability of the driver unit is independently selectable for at least two different supply voltage operating modes of the memory circuit: a high supply voltage mode (e.g., 1.8 V nominal supply voltage) and a low supply voltage mode (e.g., 1.2 V nominal supply voltage). In this case the driving capability for the high supply voltage mode is higher than the driving capability for the low supply voltage mode, particularly the area of the actively driving transistors is higher for the high supply voltage mode compared to the low supply voltage mode. Advantageously, the voltage potential of at least one first pin selects the driving capability.

The above-mentioned technical teaching is based on the idea that for high reliability of the memory circuit the timing margins are typically increased when the memory circuit is operated in a low supply voltage mode (e.g., 1.2 V) compared to an operation in a high supply voltage mode (e.g., 1.8 V). In case the memory circuit is operated in a low supply voltage mode, the driving capability is set to low, which results in a higher delay time for discharging the dummy bit line. This increases the read margin $\Delta$sa and/or the write margin $\Delta$t of the memory circuit (cf. FIG. 2 and FIG. 3), if the sense amplifier activation signal saen and/or the write buffer activation signal irwb and the word line deactivation signal wl_resetn (cf. FIG. 1) are derived from the signal on the dummy bit line, respectively. Generally, the increased read margin $\Delta$sa and/or the write margin $\Delta$t reduces the memory operating speed. Thus, the low supply voltage mode is equivalent to a low operating speed mode and the high supply voltage mode is equivalent to a high operating speed mode.

According to the above-mentioned preferred embodiment, the driver unit advantageously comprises at least two MOS-type (metal oxide semiconductor) driver transistors: A first MOS driver transistor actively drives the dummy bit line in the low supply voltage mode, whereas a second MOS driver transistor (which may comprise several parallel smaller MOS transistors) actively drives the dummy bit line in the high supply voltage mode. The transistor width of the second driver transistor is essentially i times higher than the transistor width of the first driver transistor, with i>1. Advantageously, i is a natural number. In this case the second transistor advantageously consists of i parallel transistors which are identical to the first MOS driver transistor (transistor matching).

It should be noted that necessarily not only one MOS transistor is assigned to the high or low supply voltage operation. The scope of the invention also includes that two or more MOS transistors are assigned to high or low supply voltage mode.

Additionally, it should be noted that the first MOS transistor is not necessarily switched off in the high supply voltage mode. This is due to the fact that the impact of the first MOS transistor on the driving capability of the driver unit in the high supply voltage mode is negligible (due to its small transistor area).

In one embodiment, the driving capability of the driver unit is independently selectable for the memory read access mode and for the memory write access mode. In some cases, the optimal delay for switching a control signal during read access (e.g., the signal saen) for a fixed supply voltage is different from the optimal delay for switching a control signal during write access for the same fixed supply voltage (e.g., the signal irwb). Advantageously, the selection is done via a second pin.

In one embodiment, the driving capability is selectable with respect to access mode (read or write mode) and also with respect to supply voltage mode (high or low supply voltage mode). Four different self-timing paths for the generation of control signals may be implemented. Thus, the driver unit may include at least four MOS driver transistors, including, a first MOS driver transistor actively driving the dummy bit line in case of the memory read access mode and the low supply voltage mode, a second MOS driver transistor actively driving the dummy bit line in case of the memory read access mode and the high supply voltage mode, a third MOS driver transistor actively driving the dummy bit line in case of the memory write access mode and the low supply voltage mode, and a fourth MOS driver transistor actively driving the dummy bit line in case of the memory write access mode and the high supply voltage mode.

In one embodiment, the transistor width of the second driver transistor is essentially i times higher than the transistor width of the first driver transistor, with i>1. The transistor width of the fourth driver transistor is essentially n times higher than the transistor width of the third driver transistor, with n>1. In one embodiment, the factors i and/or n are natural numbers. In this case, the corresponding transistors may be matched to each other (see transistor matching above).

It should be noted that in one embodiment, the first and/or the third MOS transistor may not be switched off in high supply voltage mode. In addition, the number of MOS driver transistors is not necessarily limited to four.

In one embodiment, the memory access means comprises a sense amplifier for memory read access, for example, a dynamic sense amplifier. The sense amplifier (e.g., sense amplifier 8 in FIG. 1) is selectively coupled to one of the plurality of bit lines and receiving data transmitted via the coupled bit line from one of the memory cells. The sense amplifier is activated by a first control signal, e.g., the signal saen in FIG. 1, which is delayed by the delay mean, i.e., generated in dependence of the signal on the dummy bit line.

In addition, the memory access means may comprise a write buffer (e.g., write buffer 9 in FIG. 1) for memory write access, which is selectively coupled to one of the plurality of bit lines and transmitting data via the coupled bit line to one of the memory cells. The write buffer is activated and deactivated by a second said control signal, e.g., the signal irwb in FIG. 1, which is delayed by the delay mean, i.e., generated in dependence of the signal on the dummy bit line.

In one embodiment, the memory access means may also comprise a word line selection mean, which selects one row of the plurality of memory cells for memory access. The selection of the word line selection means is deactivated by a third control signal, e.g., the signal wl_resetn in FIG. 1, which is delayed by the delay mean, i.e., generated in dependence of the signal on the dummy bit line.

In one embodiment, the inventive memory circuit is implemented as an SRAM circuit. Nevertheless, the scope of invention may also include other memory circuits, e.g., DRAM (dynamic random access memory) circuits, ROM (read-only memory) circuits or PROM (programmable read-only memory) circuits, particularly flash-type EEPROM (electrical erasable and programmable read-only memory) circuits.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 4:
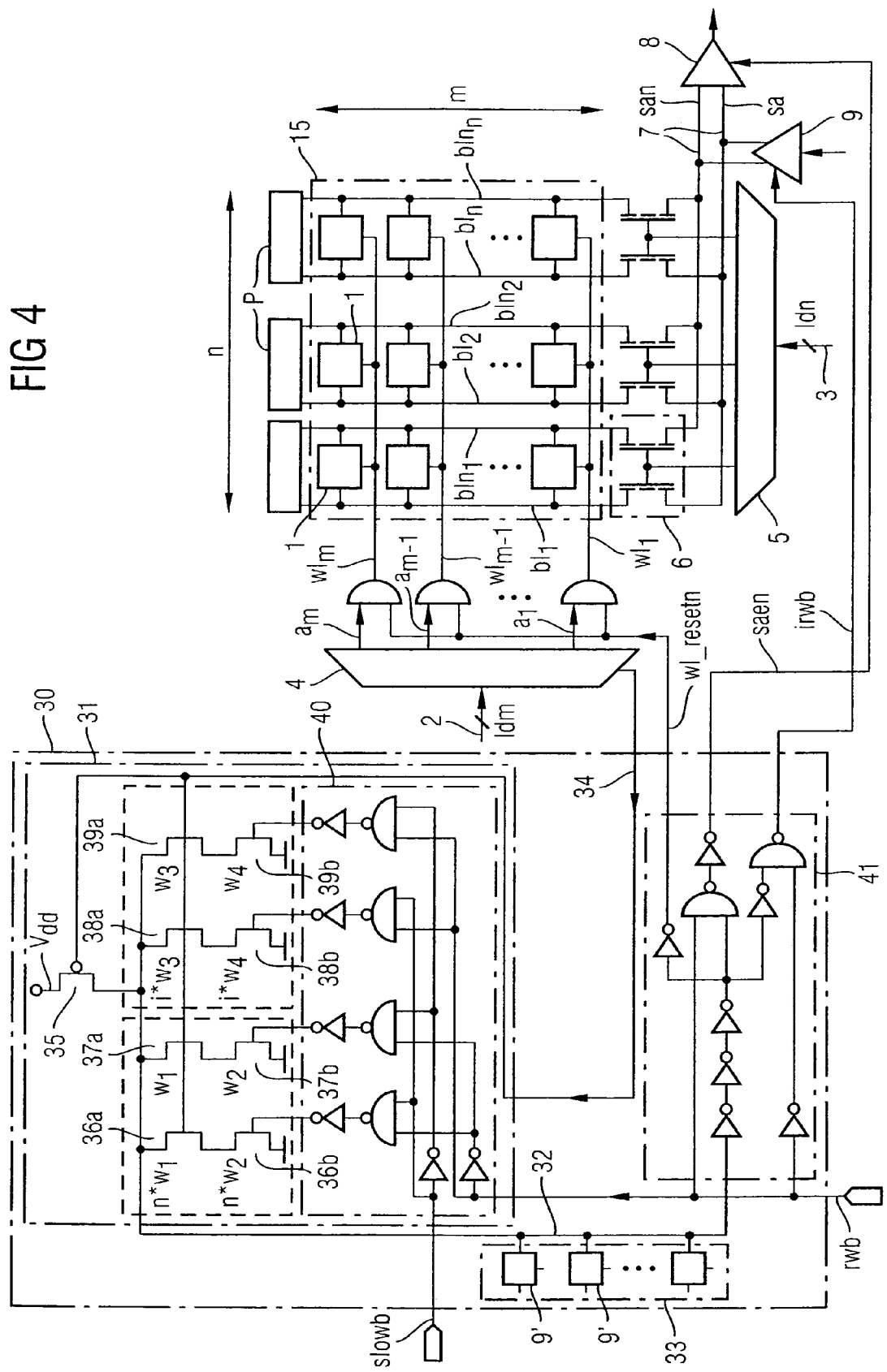
FIG. 4 shows a memory circuit according to one embodiment of the invention.

FIG. 4 illustrates a memory circuit according to one embodiment of the invention.

In one embodiment, the SRAM circuit depicted in FIG. 4 comprises a control circuit block 30 for generating the three control signals wl_resetn, irwb and saen. The circuit block 30 comprises a dummy bit line, a plurality 33 of dummy memory cells 9' connected to the dummy bit line 32 and a driver unit 31, which recharges the dummy bit line 32. The output of the dummy bit line 32 is connected to a logical circuit 41, which generates the three control signals wl_resetn, irwb and saen in dependence of the signal on the dummy bit line 32.

In one embodiment, the control circuit block 30 is driven by a dummy word line signal 34. The corresponding transmission line of the signal 34 may be designed similar or identical to one of the word lines $wl_i$ to generate a similar line capacitance and therewith a similar propagation delay.

The dummy word line signal 34 is synchronized to the signal which generates the word line decoding. The dummy word line signal 34 is received by the driver unit 31, particularly by the gates of the four NMOS driver transistors 36a-39a, with their drains connected to the dummy bit line 32, and in parallel by a precharge PMOS transistor 35.

Each NMOS driver transistor 36a-39a may be assigned to one of four possible memory circuit states, which are selected via the pins slowb (for high supply voltage mode: slowb=high; for low supply voltage mode: slowb=low) and rwb (for write access mode: rwb=low; for read access mode: rwb=high):

1. The NMOS driver transistor 36a (selected if slowb=high and rwb=low) is assigned to write access mode and high supply voltage mode.
2. The NMOS driver transistor 37a (selected if slowb=low and rwb=low) is assigned to write access mode and low supply voltage mode.
3. The NMOS driver transistor 38a (selected if slowb=high and rwb=high) is assigned to read access mode and high supply voltage mode.
4. The NMOS driver transistor 39a (selected if slowb=low and rwb=high) is assigned to read access mode and low supply voltage mode.

In one embodiment, the transistor width of the transistor 36a for write access and high supply voltage mode is n times higher than the transistor width $w_1$ of the transistor 37a for write access and low supply voltage mode. Additionally, the transistor width of the transistor 38a for read access and high supply voltage mode is i times higher than the transistor width $w_3$ of the transistor 39a for read access and low supply voltage mode. The larger the width of the selected driver transistor 36a-39a is, the faster the dummy bit line 32 is discharged. For the high supply voltage mode or for high-speed operation the larger driver transistors 36a or 38a are selected, whereas for the low supply voltage mode or for low speed operation the smaller driver transistors 37a or 39a are selected.

For the selective activation of one of the four NMOS driver transistors 36a-39a the source of each NMOS driver transistor 36a-39a is connected to the drain of a corresponding NMOS select transistor 36b-39b. The ratio of the widths of each two select transistors 36b-39b is identical to the ratio of widths of the corresponding driver transistors 36a-39a. Depending on the gate potential of the corresponding select transistor 36b-39b, the select transistor 36b-39b is switched on or off. In case the select transistor 36b-39b is off, the corresponding driver transistor 36a-39a is also switched off (independent from the signal 34). The gates of the select transistors 36b-39b are connected via the logical circuit 40 to the pins slowb and rwb. The logical circuit may be designed such that in dependence of the potential slowb and rwb only one of the four select transistors 36b-39b and therefore only one of the four driver transistors 36a-39a is selected.

If the signal 34 is low, a precharge PMOS transistor 35 is active, which precharges the dummy bit line 32 connected to the drain of the PMOS transistor 35 to the supply voltage $V_{dd}$. If the signal 34 switches from low to high, the selected (via the pins slowb and rwb) NMOS driver transistor 36a-39a is activated. The activated driver transistor 36a-39a discharges the dummy bit line 32 resulting in a logically low potential. The time for discharging the dummy bit line 32 from high to low depends on the width of the selected driver transistor 36a-39a, the total capacitance of the dummy bit line 32 and the load of the dummy bit line, mainly the plurality 33 of dummy memory cells 9'. By the usage of four different transistor widths, the delay time for discharging differs from read operation to write operation and differs from high supply voltage mode to low supply voltage mode.

The potential of the signal on the dummy bit line 32 and the potential of the pin rwb determines the potential of the 5 control signals irwb, saen and wl_resetn by means of the logical circuit 41.

In one embodiment, the NAND-gates and inverters of the logical circuit 41 are arranged in such a manner that in case the dummy bit lines 32 is discharged, i.e., the potential of the dummy bit line 32 switches from high to low, the control signal saen for the sense amplifier 8 switches from low to high if rwb is high (read access mode), the control signal irwb for the write buffer 9 switches from high to low if rwb is low (write access mode) and the control signal wl_resetn switches from high to low (independently form the signal on the pin rwb, i.e., for read and write access mode),and vice versa.

Since the number of gates in the signal propagation path differs for the signals saen and wl_resetn (read mode access) or the signals irwb and wl_resetn (write mode access) the edges do not necessarily coincide.

Figure 1:
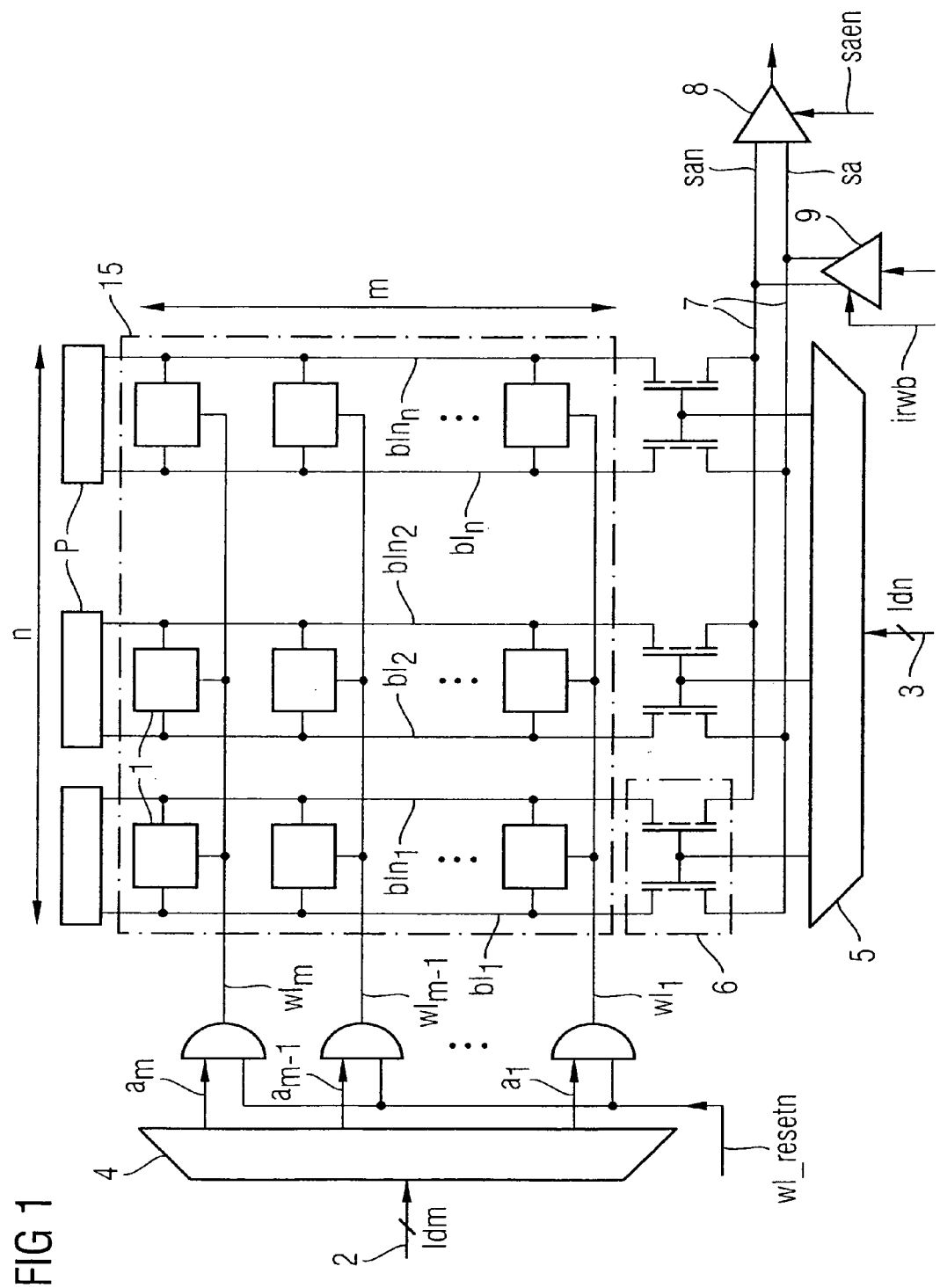
FIG. 1 shows an internal block diagram of a state-of-the-art SRAM circuit.
Figure 2:
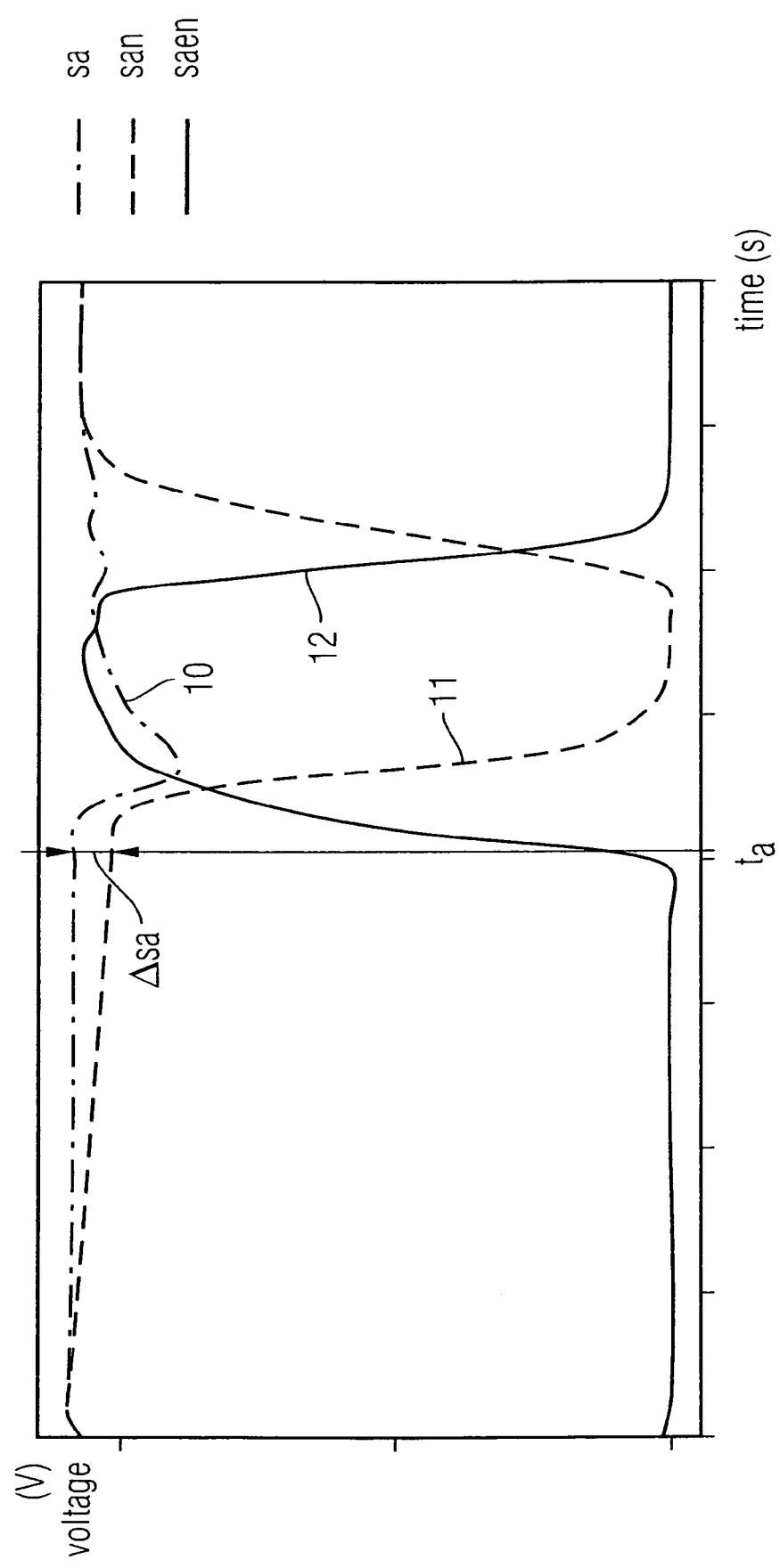
FIG. 2 shows the internal signal timing during a memory read access in a state-of-the-art or in an inventive SRAM circuit.

In one embodiment, if the dummy bit line 32 is discharged during read access, the signal saen switches from low to high (at the time instant $t_a$ in FIG. 2), which activates the sense amplifier 8. Additionally, the selected word line $wl_i$ is deactivated, since the signal wl_reset switches from high to low. The selection of the driver transistor 36a-39a determines the time for discharging the dummy bit line 32 and therewith determines the read margin $\Delta sa$ (cf. FIG. 2). The smaller the width of the selected driver transistor 36a-39a, the slower the dummy bit line 32 is discharged and the larger the read margin $\Delta sa$ is.

Figure 3:
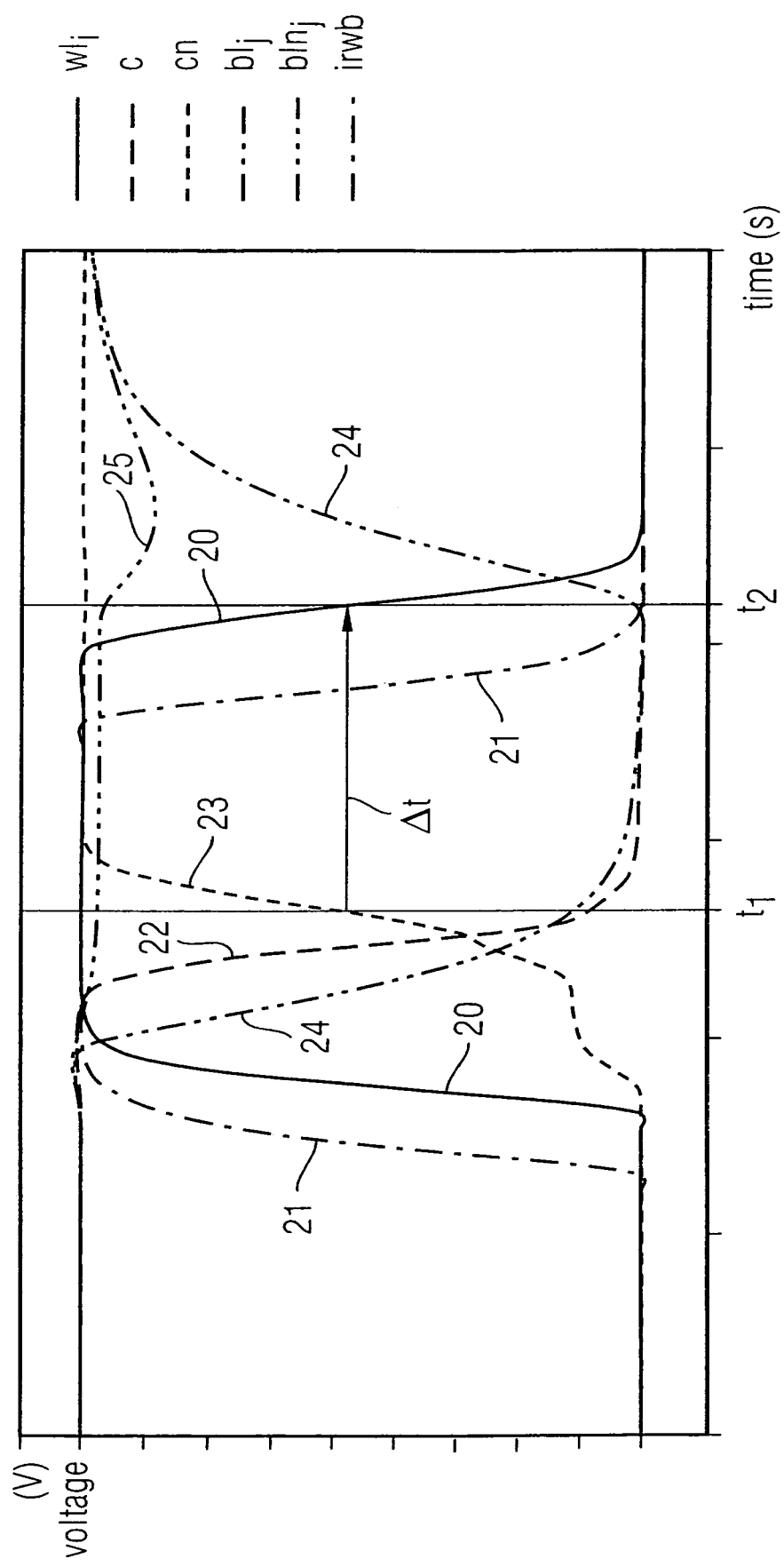
FIG. 3 shows the internal signal timing during a memory write access in a state-of-the-art or in an inventive SRAM circuit.

During write access, the write buffer 9 is already activated (cf. FIG. 3) prior to the discharge of the dummy bit line 32. When the dummy bit line 32 is discharged, the signal irwb switches from high to low (cf. FIG. 3) stopping the operation of the write buffer 9. In addition, the selected word line $wl_i$ is deactivated since the signal wl_reset switches from high to low. The selection of the driver transistor 36a-39a determines the time for discharging the dummy bit line 32 and therewith determines the write margin $\Delta t$ (cf. FIG. 3). The smaller the width of the selected driver transistor 36a-39a, the slower the dummy bit line 32 is discharged and the larger the write margin $\Delta t$ is.

In general, if the read margin $\Delta sa$ and/or the write margin $\Delta t$ are increased, the operating speed of the circuit is decreased.

In conclusion it should be noted that the inventive concept of an adjustable delay in view of two or more different supported supply voltage modes might also be employed in view of two or more different selectable operating speed modes of the memory circuit, with each speed mode being operated at a different supply voltage.

While the foregoing is directed to embodiments of the present invention, other and further embodiments of the invention may be devised without departing from the basic scope thereof, and the scope thereof is determined by the claims that follow.

What is claimed is:

1. A memory circuit comprising:
    a plurality of memory cells organized in rows and columns;
    memory access circuitry controlled by at least one control signal; and
    control circuitry for generating the at least one control signal comprising:
        delay circuitry which delays a switching of the at least one control signal with a respective delay time being adjustable in view of an applied supply voltage, wherein
        the memory access circuitry supports a memory read access mode and a memory write access mode; and
        the delay time is independently selectable for the memory read access mode and for the memory write access mode.

2. The memory circuit of claim 1, wherein:
    the memory circuit comprises a plurality of bit lines each coupled to a column of the plurality of memory cells; and
    the delay circuitry comprises:
        a dummy bit line coupled to dummy memory cells, wherein a signal transmission behavior of the dummy bit line is characteristic of a signal transmission behavior of the bit lines, and wherein the at least one control signal is generated using a signal on the dummy bit line; and
        a driver unit driving the dummy bit line, wherein the driver discharges the dummy bit line.

3. The memory circuit of claim 2, wherein a driving capability of the driver unit is independently selectable for at least two different supply voltage operating modes of the memory circuit, wherein the supply voltage operating modes include a high supply voltage mode and a low supply voltage mode, and wherein the driving capability for the high supply voltage mode is higher than the driving capability for the low supply voltage mode.

4. A memory circuit comprising:
    a plurality of memory cells organized in rows and columns;
    a plurality of bit lines each coupled to a column of the plurality of memory cells;
    memory access circuitry controlled by at least one control signal; and
    control circuitry for generating the at least one control signal comprising:
    delay circuitry which delays a switching of the at least one control signal with a respective delay time being adjustable in view of an applied supply voltage, wherein the delay circuitry comprises:
        a dummy bit line coupled to dummy memory cells, wherein a signal transmission behavior of the dummy bit line is characteristic of a signal transmission behavior of the bit lines, and wherein the at least one control signal is generated using the signal on the dummy bit line; and
        a driver unit driving the dummy bit line, wherein the driver discharges the dummy bit line, wherein a driving capability of the driver unit is independently selectable for at least two different supply voltage operating modes of the memory circuit, wherein the supply voltage operating modes include a high supply voltage mode and a low supply voltage mode, and wherein the driving capability for the high supply voltage mode is higher than the driving capability for the low supply voltage mode.

5. The memory circuit of claim 4, wherein the driver unit comprises:
    a first MOS driver transistor actively driving the dummy bit line in the low supply voltage mode;

a second MOS driver transistor actively driving the dummy bit line in the high supply voltage mode, wherein a transistor width of the second driver transistor is i times higher than the transistor width of the first driver transistor, where i>1 and wherein i is a natural number.

6. The memory circuit of claim 4, wherein the driving capability of the driver unit is independently selectable for a memory read access mode and for the memory write access mode via a second pin.

* * * * *